(12) United States Patent
Blackwell et al.

(10) Patent No.: US 11,217,455 B2
(45) Date of Patent: Jan. 4, 2022

(54) CARBON-BASED DIELECTRIC MATERIALS FOR SEMICONDUCTOR STRUCTURE FABRICATION AND THE RESULTING STRUCTURES

(71) Applicant: Intel Corporation, Santa Clara, CA (US)

(72) Inventors: James M. Blackwell, Portland, OR (US); Tayseer Mahdi, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 28 days.

(21) Appl. No.: 16/954,419

(22) PCT Filed: Mar. 28, 2018

(86) PCT No.: PCT/US2018/024771
§ 371 (c)(1),
(2) Date: Jun. 16, 2020

(87) PCT Pub. No.: WO2019/190495
PCT Pub. Date: Oct. 3, 2019

(65) Prior Publication Data
US 2021/0057230 A1  Feb. 25, 2021

(51) Int. Cl.
*H01L 21/027* (2006.01)
*H01L 21/033* (2006.01)
(Continued)

(52) U.S. Cl.
CPC ........ *H01L 21/31122* (2013.01); *C23C 16/26* (2013.01); *H01L 21/0271* (2013.01);
(Continued)

(58) Field of Classification Search
CPC ... H01L 29/41; H01L 29/417; H01L 29/4179; H01L 29/41791; H01L 29/66;
(Continued)

(56) References Cited

U.S. PATENT DOCUMENTS

2007/0057253 A1* 3/2007 Gronbeck ............... G03F 7/11
257/40
2008/0009647 A1 1/2008 Hatakeyama et al.
(Continued)

FOREIGN PATENT DOCUMENTS

JP 2010-156985 7/2010
KR 10-2016-0146881 12/2016

OTHER PUBLICATIONS

International Search Report and Written Opinion for International Patent Application No. PCT/US2018/024771 dated Dec. 18, 2018, 11 pgs.
(Continued)

*Primary Examiner* — Monica D Harrison
(74) *Attorney, Agent, or Firm* — Schwabe, Williamson & Wyatt, P.C.

(57) ABSTRACT

Carbon-based dielectric materials for semiconductor structure fabrication, and the resulting structures, are described. In an example, method of patterning a layer for a semiconductor structure includes forming a plurality of trenches in a dielectric layer above a semiconductor layer above a substrate to form a patterned dielectric layer. The method also includes filling the plurality of trenches with an adamantane-based carbon hardmask material. The method also includes removing the patterned dielectric layer selective to the adamantane-based carbon hardmask material. The method also includes using the adamantane-based carbon hardmask material to pattern the semiconductor layer.

20 Claims, 16 Drawing Sheets

(51) Int. Cl.
*C23C 16/26* (2006.01)
*H01L 21/311* (2006.01)
*H01L 21/8234* (2006.01)
*H01L 29/417* (2006.01)
*H01L 29/66* (2006.01)
*H01L 29/78* (2006.01)

(52) U.S. Cl.
CPC .. *H01L 21/0337* (2013.01); *H01L 21/823431* (2013.01); *H01L 29/41791* (2013.01); *H01L 29/66795* (2013.01); *H01L 29/785* (2013.01)

(58) Field of Classification Search
CPC ............... H01L 29/667; H01L 29/6679; H01L 29/66795; H01L 29/78; H01L 29/785; H01L 21/02; H01L 21/027; H01L 21/0271; H01L 21/03; H01L 21/033; H01L 21/0337; H01L 21/31; H01L 21/311; H01L 21/3112; H01L 21/31122; H01L 21/82; H01L 21/823; H01L 21/8234; H01L 21/82343; H01L 21/823431; C23C 16/26
USPC .......................................................... 257/365
See application file for complete search history.

(56) References Cited

U.S. PATENT DOCUMENTS

| | | |
|---|---|---|
| 2009/0163035 A1 | 6/2009 | Romano et al. |
| 2014/0094035 A1 | 4/2014 | Ji et al. |
| 2017/0059995 A1 | 3/2017 | Furutani et al. |

OTHER PUBLICATIONS

International Preliminary Report on Patentability for International Patent Application No. PCT/US2018/024771, dated Oct. 8, 2020, 7 pgs.

* cited by examiner

PLAN VIEW

CROSS-SECTIONAL VIEW

CROSS-SECTIONAL VIEWS　　　　　　　　PLAN VIEWS

CROSS-SECTIONAL VIEWS    PLAN VIEWS exemplary method for polymerizing disubstituted diamantane into oligomeric or polymeric (n) form, in accordance with an embodiment of the present disclosure.
CARBON-BASED DIELECTRIC MATERIALS FOR SEMICONDUCTOR STRUCTURE FABRICATION AND THE RESULTING STRUCTURES

CROSS-REFERENCE TO RELATED APPLICATION

This patent application is a U.S. National Phase Application under 35 U.S.C. § 371 of International Application No. PCT/US2018/024771, filed Mar. 28, 2018, entitled "CARBON-BASED DIELECTRIC MATERIALS FOR SEMICONDUCTOR STRUCTURE FABRICATION AND THE RESULTING STRUCTURES," which designates the United States of America, the entire disclosure of which is hereby incorporated by reference in its entirety and for all purposes.

TECHNICAL FIELD

Embodiments of the disclosure are in the field of semiconductor structures and processing and, in particular, carbon-based dielectric materials for semiconductor structure fabrication, and the resulting structures.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

In a first aspect, integrated circuits commonly include electrically conductive microelectronic structures, which are known in the art as vias, to electrically connect metal lines or other interconnects above the vias to metal lines or other interconnects below the vias. Vias are typically formed by a lithographic process. Representatively, a photoresist layer may be spin coated over a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

One challenge is that the overlay between the vias and the overlying interconnects, and the overlay between the vias and the underlying landing interconnects, generally need to be controlled to high tolerances on the order of a quarter of the via pitch. As via pitches scale ever smaller over time, the overlay tolerances tend to scale with them at an even greater rate than lithographic equipment is able to keep up. Thus, improvements are needed in the area of via and related interconnect manufacturing technologies.

In a second aspect, multi-gate transistors, such as tri-gate transistors, have become more prevalent as device dimensions continue to scale down. In conventional processes, tri-gate or other non-planar transistors are generally fabricated on either bulk silicon substrates or silicon-on-insulator substrates. In some instances, bulk silicon substrates are preferred due to their lower cost and compatibility with the existing high-yielding bulk silicon substrate infrastructure. Scaling multi-gate transistors has not been without consequence, however. As the dimensions of these fundamental building blocks of microelectronic circuitry are reduced and as the sheer number of fundamental building blocks fabricated in a given region is increased, the constraints on the semiconductor processes used to fabricate these building blocks have become overwhelming. Thus, improvements are needed in the area of non-planar transistor manufacturing technologies.

DESCRIPTION OF THE EMBODIMENTS

Figure 1:
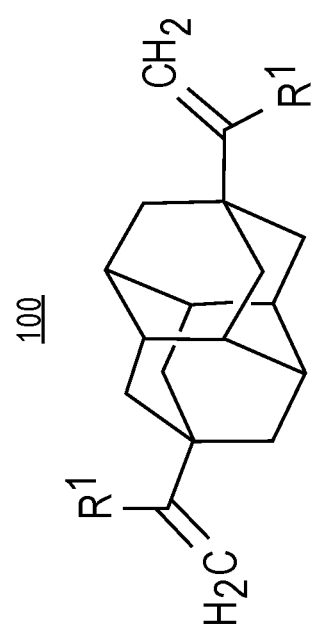
FIG. 1 is a schematic showing an exemplary method for polymerizing disubstituted diamantane into oligomeric or polymeric (n) form, in accordance with an embodiment of the present disclosure.
Figure 1:
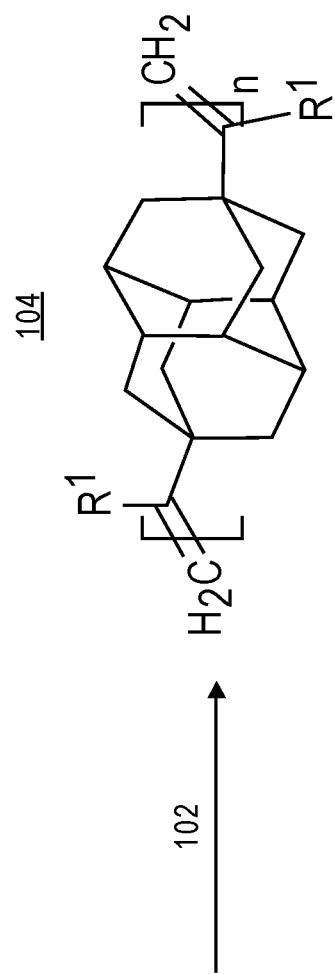

Carbon-based dielectric materials for semiconductor structure fabrication, and the resulting structures, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments are directed to fabrication of a material layer, such as a hardmask layer, having properties suitable for high aspect ratio gapfill. The described materials may be composed of etch resistant, insulating carbon formed using oligomeric and polymeric diamondoid spin-on precursors. Embodiments described herein may be implemented to enable patterning techniques for fabricating semiconductor devices or structures having a pitch or 20 nanometers (20 nm) or less. Embodiments described herein may be implemented enable the fabrication of etch resistant fill materials.

To provide context, the presently does not exist a viable approach for depositing carbon having a diamond-like state into high aspect ratio features. This has precluded the use of such materials in new integration schemes requiring multiple etch selectivities, referred to as colors. In accordance with one or more embodiments described herein, multi-functional adamantanes, diamantanes, triamantanes etc. (referred to generally herein as adamantane-based precursors) are used to synthesize small oligomers and polymers. The resulting carbon hardmask material (referred to herein as adamantane-based carbon hardmask material) can be delivered as a material having a high percentage of sp3-hybridized carbon into features that are challenging to fill.

Using diamantane as representative of a family of adamantanes, FIG. 1 is a schematic showing an exemplary method for polymerizing disubstituted diamantane 100 into oligomeric or polymeric (n) form 104, in accordance with an embodiment of the present disclosure. In the particular example shown, divinyl-diamantane is used as the precursor 100. The process 102 for forming the oligomeric or polymeric (n) form 104 may involve use of a ruthenium (Ru) metathesis catalyst. The oligomeric or polymeric (n) form 104 may be suitable for delivery using, e.g., spin-coating. In an embodiment, C=C bonds are included along the polymer chain or in the R1 group and provide sites for thermal, UV or other curing once the material is deposited into a selected feature.

Figure 2:
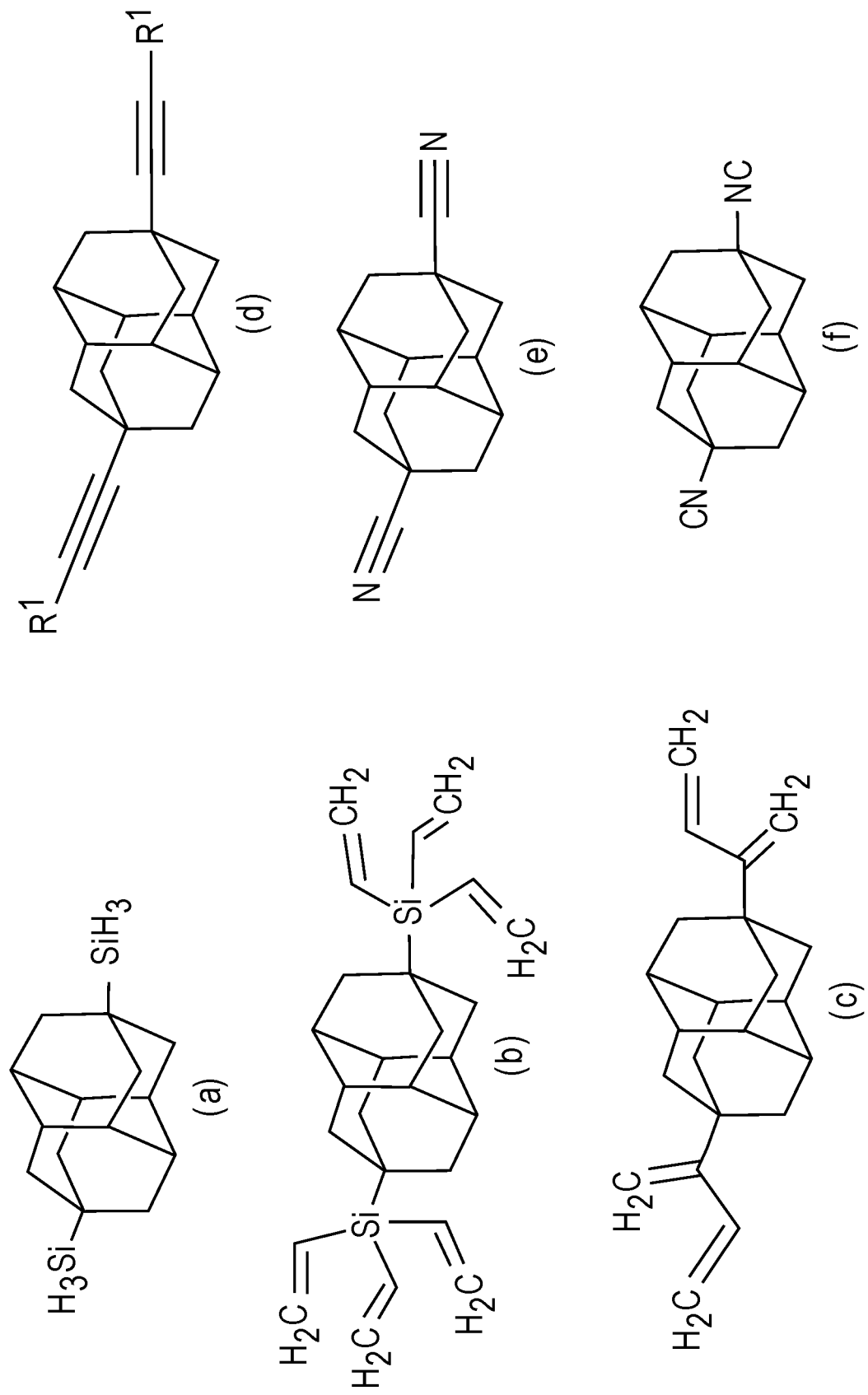
FIG. 2 illustrates exemplary functionalized diamantanes (a)-(f) that can be polymerized (alone or with another monomer), in accordance with an embodiment of the present disclosure.

FIG. 2 illustrates exemplary functionalized diamantanes (a)-(f) that can be polymerized (alone or with another monomer), in accordance with an embodiment of the present disclosure. The oligomers or polymers resulting from treatment of the exemplary functionalized diamantanes (a)-(f), such as by process 102, may then be used as spin-coating precursors to provide high carbon content where the majority of carbon is already in a diamond-like structure.

In another aspect, it is to be appreciated that many of the molecules described herein may be used in monomeric form as volatile precursors for flowable CVD approaches for filling features. In such a scenario, the monomers may be delivered to a surface where a high energy plasma or catalyst is used to initiate oligomerization at low temperature allowing newly formed molecules to flow into features prior to curing.

To provide further context, for many novel patterning techniques, a set of materials is needed with unique etch characteristics. Along with etch selectivity, such patterning schemes may also require the materials to have the ability to uniformly fill features of various pitch and aspect ratios. Standard methods may be unable to meet this fill requirement. For example, chemical vapor deposition (CVD) based approaches tend to pinch off forming voids. On the other hand, ALD based approaches can fill features but leave a seam. The above approaches may also be hampered by associated non-uniform etch rates from a top of the structure to a bottom of the structure.

Figure 3A:
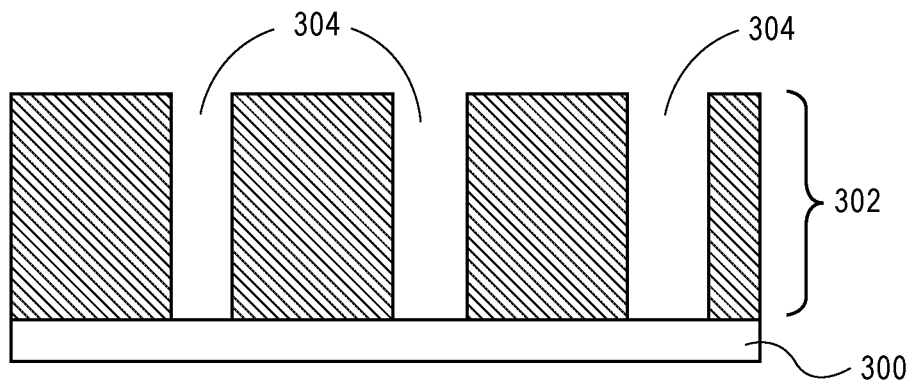
FIGS. 3A-3C illustrate cross-sectional views representing various operations in a method of fabricating a patterned adamantane-based carbon hardmask, in accordance with an embodiment of the present disclosure.
Figure 3B:
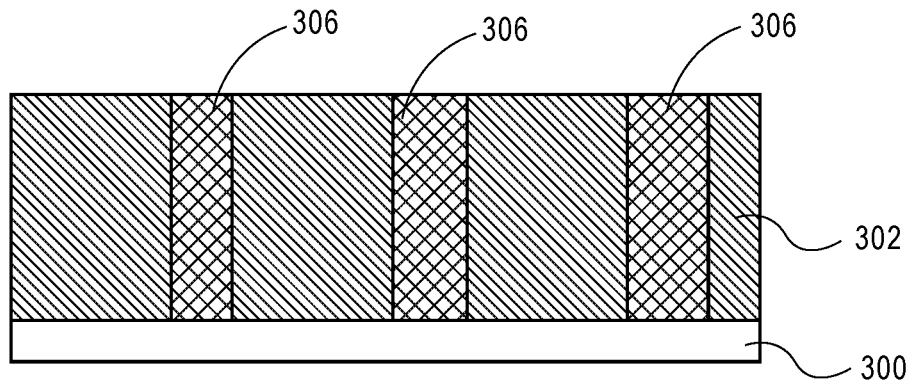
Figure 3C:
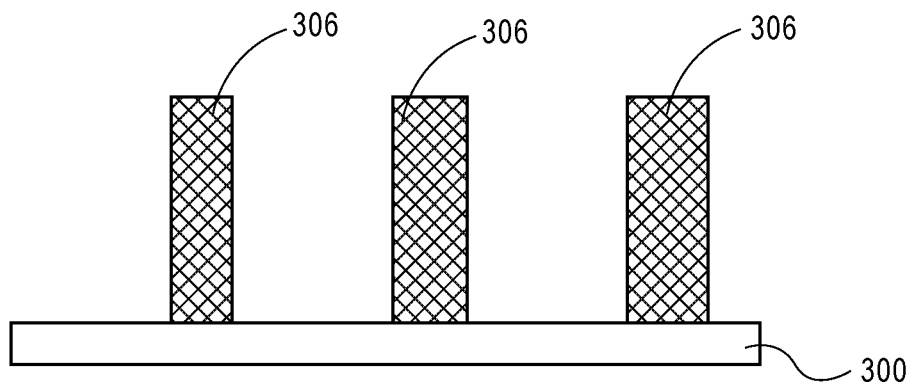

In a first application of materials described herein, FIGS. 3A-3C illustrate cross-sectional views representing various operations in a method of fabricating a patterned adamantane-based carbon hardmask, in accordance with an embodiment of the present disclosure.

Referring to FIG. 3A, a method of fabricating a patterned adamantane-based carbon hardmask for semiconductor structure fabrication includes first forming a patterned material layer 302 above a substrate or underlying structure 300. The patterned material layer 302 includes a plurality of trenches 304 formed therein. In an embodiment, the patterned material layer 302 is a patterned hardmask layer. In an embodiment, the patterned material layer 302 is a patterned dielectric layer.

In an embodiment, the trenches 304 in the patterned material layer 302 are formed using a pitch division processing and patterning scheme. Pitch division patterning typically refers to pitch halving, pitch quartering etc. Pitch division schemes may be applicable to FEOL processing, BEOL processing, or both FEOL (device) and BEOL (metallization) processing. In accordance with one or more embodiments described herein, optical lithography is first implemented to print unidirectional lines (e.g., either strictly unidirectional or predominantly unidirectional) in a pre-defined pitch, e.g., to form a grating structure. Pitch division processing is then implemented as a technique to increase line density.

Referring to FIG. 3B, an adamantane-based carbon hardmask material 306 is formed in the trenches 304 of the patterned material layer 302. In an embodiment, the adamantane-based carbon hardmask material 306 is formed using a spin-on deposition process or a flowable chemical vapor deposition process. In an embodiment, the adamantane-based carbon hardmask material 306 is formed from an adamantane monomer precursor, as described in association with FIG. 1.

In an embodiment, the adamantane-based carbon hardmask material 306 is a spin-on material that has been optimized to fill high aspect ratio features. In an embodiment, the adamantane-based carbon hardmask material 306 can provide for uniform fill of up to 10:1 (height to width) aspect ratio features, and even up to 20:1 or 30:1, e.g., trenches formed in a conventional hardmask layer.

In an embodiment, the layer 302 that now includes adamantane-based carbon hardmask material 306 therein is referred to as a two-color structure because of the dual etch properties of the film, e.g., the etch properties of the hardmask or ILD 302 and the etch properties of the adamantane-based carbon hardmask material 306. In an embodiment, the adamantane-based carbon hardmask material 306 of the two color system has a unique etch selectivity and good fill (e.g., no voids or seams).

The structure of FIG. 3B may be used to ultimately pattern an underlying semiconductor layer. As an example, FIG. 3C illustrates a cross-sectional view representing an operation in a method of using an adamantane-based carbon hardmask material for semiconductor structure manufacture, in accordance with an embodiment of the present disclosure.

Referring to FIG. 3C, the patterned material layer 302 is removed the selective to the adamantane-based carbon hardmask material 306. In an embodiment, the patterned material layer 302 is a patterned carbon-doped silicon oxide material and is removed using an etch process selective to the adamantane-based carbon hardmask material 306. The pattern formed by the remaining adamantane-based carbon hardmask material 306 may then be transferred to an underlying semiconductor layer (e.g., in this case, substrate 300 is a semiconductor substrate or is a substrate having a semiconductor layer thereon). Overall, the process may effectively be viewed as a negative-tone process.

As such, in an embodiment, the adamantane-based carbon hardmask material 306 is used as an etch mask for etching a semiconductor layer. In an embodiment, the adamantane-based carbon hardmask material 306 is used as an etch mask for etching a plurality of semiconductor fins in a semiconductor layer. In another embodiment, the adamantane-based carbon hardmask material 306 is used as an etch mask for etching a plurality of gate lines in a semiconductor layer. In either case, in an embodiment, the adamantane-based carbon hardmask material 306 is a sacrificial material in that it is ultimately removed, e.g., by an ash process.

FIGS. 4A-4D illustrate cross-sectional views representing various operations in a method of using an adamantane-based carbon hardmask material for semiconductor structure manufacture, in accordance with an embodiment of the present disclosure.

Figure 4A:
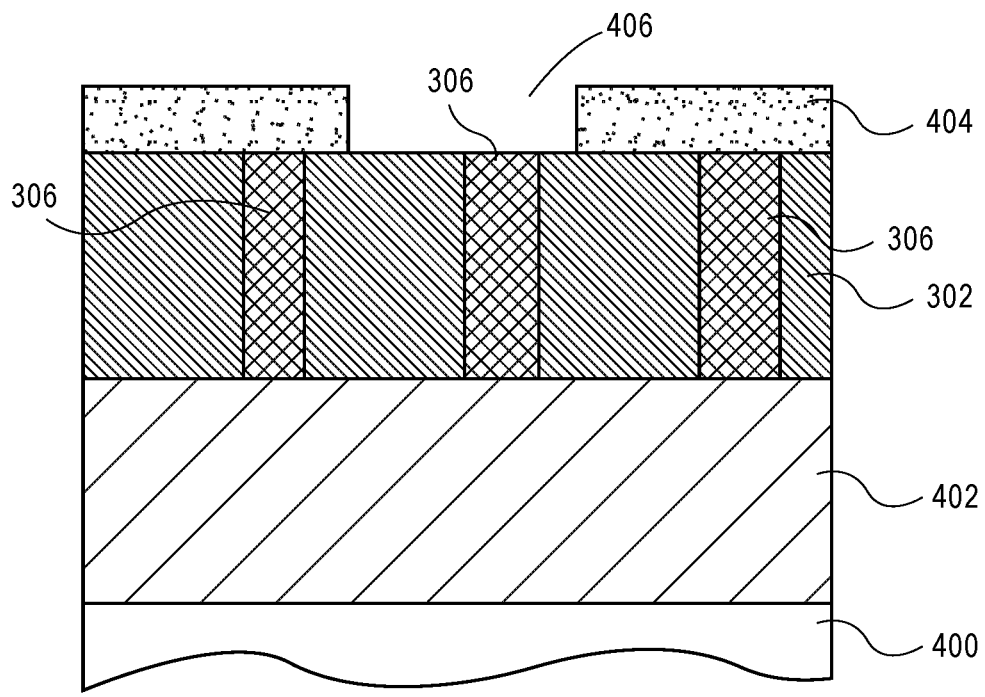
FIGS. 4A-4D illustrate cross-sectional views representing various operations in a method of using an adamantane-based carbon hardmask material for semiconductor structure manufacture, in accordance with an embodiment of the present disclosure.

Referring to FIG. 4A, the structure of FIG. 3B is shown having a patterned resist or hardmask layer 404 formed thereon. In an embodiment, the patterned material layer 302 is a patterned hardmask layer. Additionally, an inter-layer dielectric layer 402 is depicted above a substrate 400, below the patterned material layer 302 having the adamantane-based carbon hardmask material 306 formed in trenches therein. In an embodiment, the plurality of trenches represents all possible via locations for a metallization layer.

In an embodiment, an opening 406 is formed in patterned resist or hardmask layer 404. In an embodiment, a lithographic exposure is performed to form opening 406 using a relatively large exposure window. For example, in one embodiment, a trench in the center of the exposure window is selected as a via location for ultimate adamantane-based carbon hardmask material 306 clearance. Neighboring hardmask material (portions of 302) are exposed but are not impacted by a subsequent etch process because of the dual etch selectivity of the layer 302 and the adamantane-based carbon hardmask material 306 As such, even though the neighboring regions are exposed adjacent to one or both sides of the selected trench for via formation, these regions are not impacted by a process used to remove the adamantane-based carbon hardmask material 306 from the selected via location or locations.

Figure 4B:
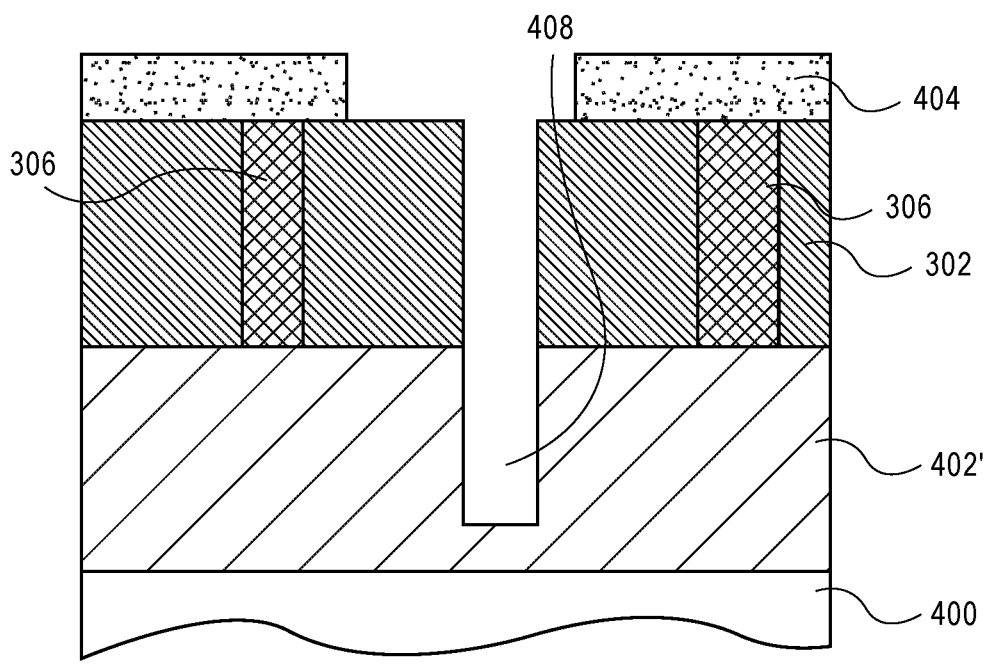

Referring to FIG. 4B, the exposed one of the adamantane-based carbon hardmask material 306 regions is removed. In one embodiment, the removal represents removal of the adamantane-based carbon hardmask material 306 from fewer than all of the plurality of trenches to define selected via locations for the metallization layer. The patterned hardmask layer 302 and remaining portions of the adamantane-based carbon hardmask material 306 are used as a mask to form one or more via trenches 408 in the ILD layer 402 to form once-patterned ILD layer 402'. In one embodiment, the trench 408 represents an eventual interconnect line location having an associated underlying via. Accordingly, the etch process used to form trench 408 is, in one embodiment, a via selection process based on selection and removal of an adamantane-based carbon hardmask material 306.

Figure 4C:
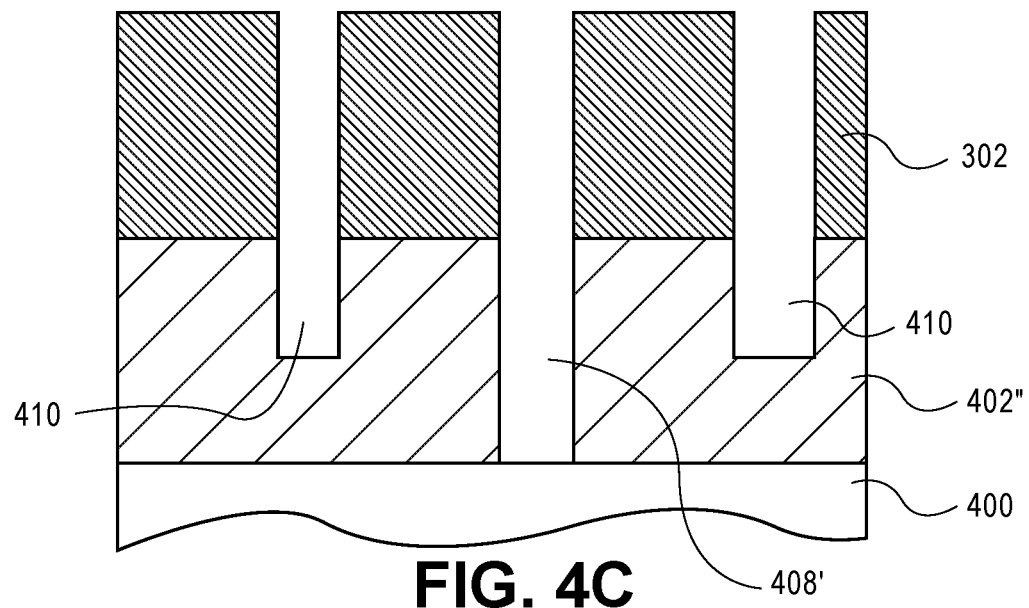

Referring to FIG. 4C, the remaining portions of the adamantane-based carbon hardmask material 306 are removed. The patterned hardmask layer 302 is then used as a mask to form line trenches 410 in the ILD layer 402' and to extend the one or more via trenches 408 to form corresponding one or more extended via trenches 408' in a twice-patterned ILD layer 402". In an embodiment, a dry etch process is used to pattern twice-patterned dielectric layer 402".

Figure 4D:
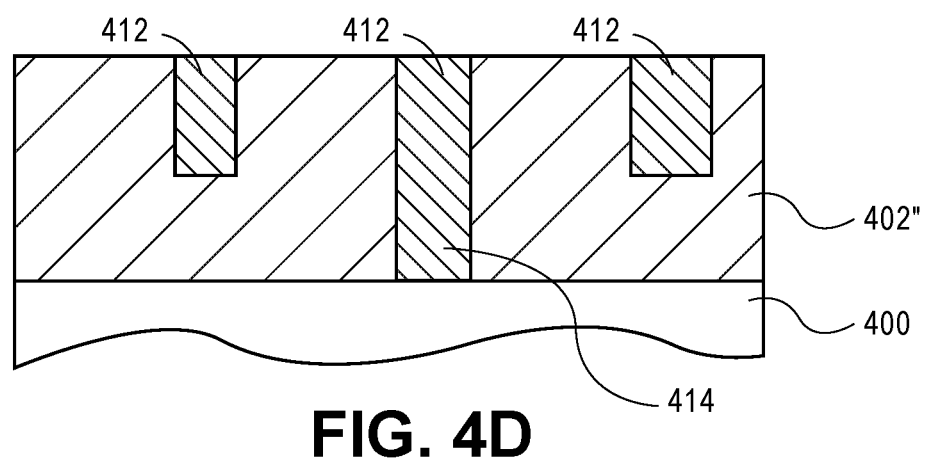

Referring to FIG. 4D, the patterned hardmask layer 302 is removed. The one or more extended via trenches 408' and the line trenches 410 are then filled with a conductive material to form a plurality of metal lines 4312 and one or more underlying conductive vias 414. In an embodiment, the plurality of metal lines 412 and one or more underlying conductive vias 414 are formed by a metal deposition and subsequent planarization process.

It is to be appreciated that the resulting structure of FIG. 4D may subsequently be used as a foundation for forming subsequent metal line/via and ILD layers. Alternatively, the structure of FIG. 4D may represent the final metal interconnect layer in an integrated circuit.

In a second application of materials described herein, one or more embodiments are directed to approaches for, and structures formed from, landing a gate contact via directly on an active transistor gate. Such approaches may eliminate the need for extension of a gate line on isolation for contact purposes. Such approaches may also eliminate the need for a separate gate contact layer to conduct signals from a gate line or structure. In an embodiment, eliminating the above features is achieved by recessing contact metals in a trench contact and introducing an additional dielectric material in the process flow. The additional dielectric material is included as a trench contact dielectric cap layer with etch characteristics different from the gate dielectric material cap layer already used for trench contact alignment in a gate aligned contact process processing scheme.

Figure 5A:
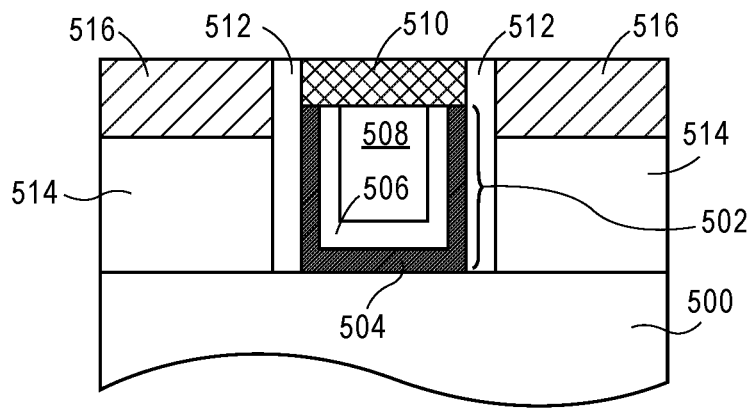
FIGS. 5A-5C illustrates selective etching of a gate electrode cap layer relative to a contact cap layer for self-aligned gate contact fabrication, in accordance with an embodiment of the present disclosure.
Figure 5B:
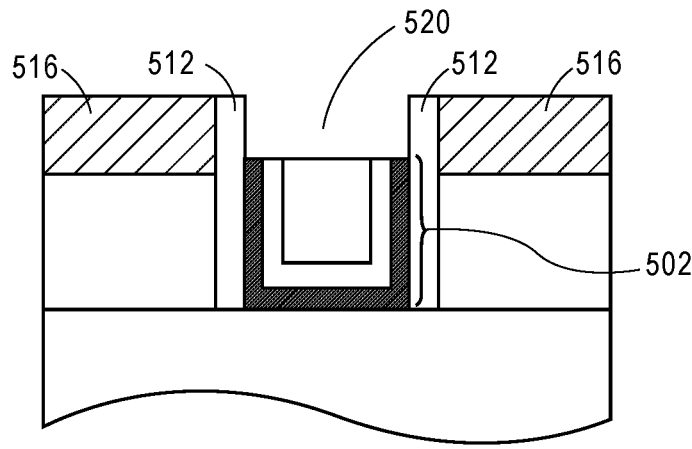
Figure 5C:
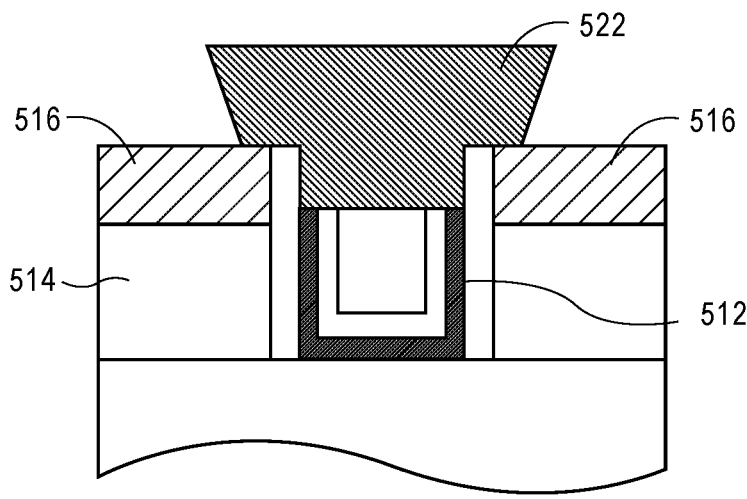

As an example, FIGS. 5A-5C illustrates selective etching of a gate electrode cap layer relative to a contact cap layer for self-aligned gate contact fabrication, in accordance with an embodiment of the present disclosure.

Referring to FIG. 5A, a gate stack 502 is formed on or above a substrate 500. First and second conductive trench contacts 514 are at first and second sides of the gate stack 502, respectively, with an optional dielectric spacer 512 formed there between. A first hardmask component 510 is formed on and aligned with an uppermost surface of the gate stack 502. A second hardmask component 516 is formed on and aligned with the first and second conductive trench contacts 514. The first 510 and second 516 hardmask components differ in composition from one another. In an embodiment, the first hardmask component 510 or the second hardmask component 516 is an adamantane-based carbon hardmask material. In a particular such embodiment, the first hardmask component 510 includes or is an adamantane-based carbon hardmask material. In an embodiment, the gate stack 502 includes a high-k gate dielectric layer 504, a workfunction gate electrode layer 506 and a conducive fill layer 508, as is depicted.

Referring to FIG. 5B, the first hardmask component 510 is removed from over the gate electrode 502 to form an opening 520 above gate electrode 502. It is to be appreciated that the opening 520 may expose only a portion of the gate electrode 502, where portions of the gate electrode 502 into and out of the page of the perspective shown remain covered by remaining unetched portions of the first hardmask component 510. In an embodiment, the first hardmask component 510 is removed selective to the second hardmask component 516 and, if applicable, selective to the dielectric spacers 512.

Referring to FIG. 5C, a conductive via 522 is formed in the opening 520 in the first hardmask component and on a portion of the gate stack 502. In an embodiment, a portion of the conductive via 522 is on a portion of the second hardmask component 516, as is depicted.

In a third application of materials described herein, FIGS. 6A-6H illustrate portions of integrated circuit layers representing various operations in a method of using an adamantane-based carbon hardmask material for semiconductor structure fabrication, in accordance with another embodiment of the present disclosure. In each illustration at each described operation, an angled three-dimensional cross-section view is provided.

Figure 6A:
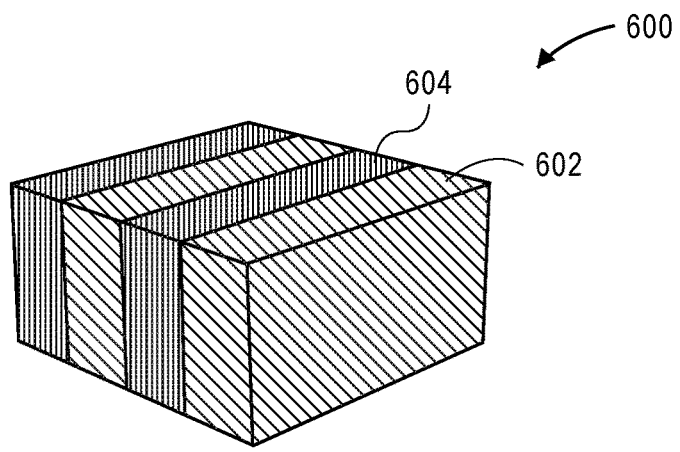
FIGS. 6A-6H illustrate portions of integrated circuit layers representing various operations in a method of using an adamantane-based carbon hardmask material for semiconductor structure fabrication, in accordance with another embodiment of the present disclosure.

FIG. 6A illustrates a starting point structure 600 for a subtractive via and plug process following deep metal line fabrication, in accordance with an embodiment of the present disclosure. Referring to FIG. 6A, structure 600 includes metal lines 602 with intervening interlayer dielectric (ILD) lines 604. It is to be appreciated that some of the lines 602 may be associated with underlying vias for coupling to a previous interconnect layer. In an embodiment, the metal lines 602 are formed by patterning trenches into an ILD material (e.g., the ILD material of lines 604). The trenches are then filled by metal and, if needed, planarized to the top of the ILD lines 604. In an embodiment, the metal trench and fill process involves high aspect ratio features. For example, in one embodiment, the aspect ratio of metal line height to metal line width is approximately in the range of 5-10.

Figure 6B:
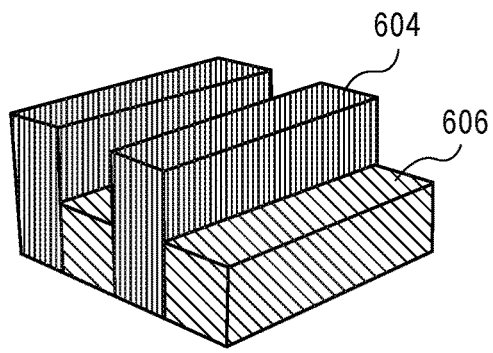

FIG. 6B illustrates the structure of FIG. 6A following recessing of the metal lines, in accordance with an embodiment of the present disclosure. Referring to FIG. 6B, the metal lines 602 are recessed selectively to provide first level metal lines 606. The recessing is performed selectively to the ILD lines 604. The recessing may be performed by etching through dry etch, wet etch, or a combination thereof. The extent of recessing may be determined by the targeted thickness of the first level metal lines 606 for use as suitable conductive interconnect lines within a back end of line (BEOL) interconnect structure.

Figure 6C:
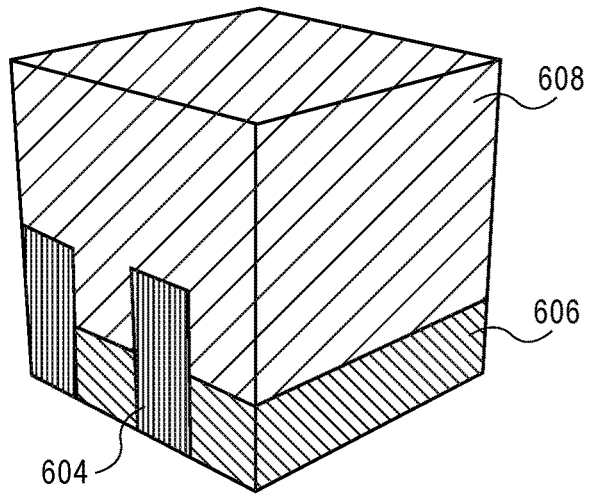

FIG. 6C illustrates the structure of FIG. 6B following formation of an interlayer dielectric (ILD) layer, in accordance with an embodiment of the present disclosure. Referring to FIG. 6C, an ILD material layer 608 is deposited and, if necessary, planarized, to a level above the recessed metal lines 606 and the ILD lines 604.

Figure 6D:
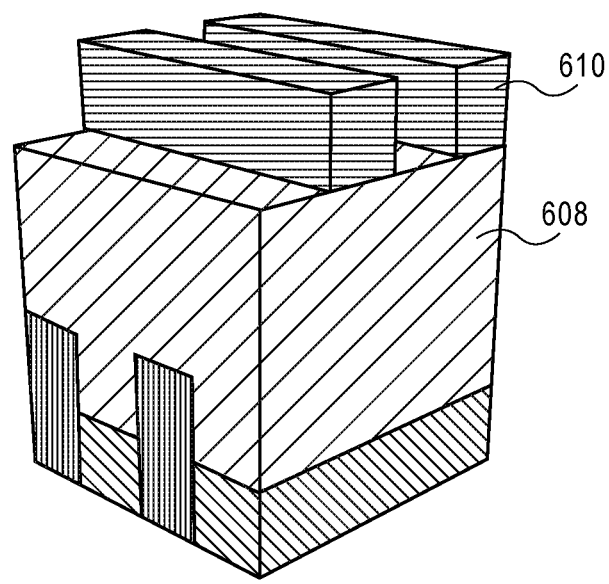

FIG. 6D illustrates the structure of FIG. 6C following deposition and patterning of a hardmask layer, in accordance with an embodiment of the present disclosure. Referring to FIG. 6D a hardmask layer 610 is formed on the ILD layer 608. In one such embodiment, the hardmask layer 610 is formed with a grating pattern orthogonal to the grating pattern of the first level metal lines 606/ILD lines 604, as is depicted in FIG. 6D. In an embodiment, the grating structure formed by the hardmask layer 610 is a tight pitch grating structure. In one such embodiment, the tight pitch is not achievable directly through conventional lithography. For example, a pattern based on conventional lithography may first be formed, but the pitch may be halved by the use of spacer mask patterning. Even further, the original pitch may be quartered by a second round of spacer mask patterning. Accordingly, the grating-like pattern of the second hardmask layer 610 of FIG. 6D may have hardmask lines spaced at a constant pitch and having a constant width.

Figure 6E:
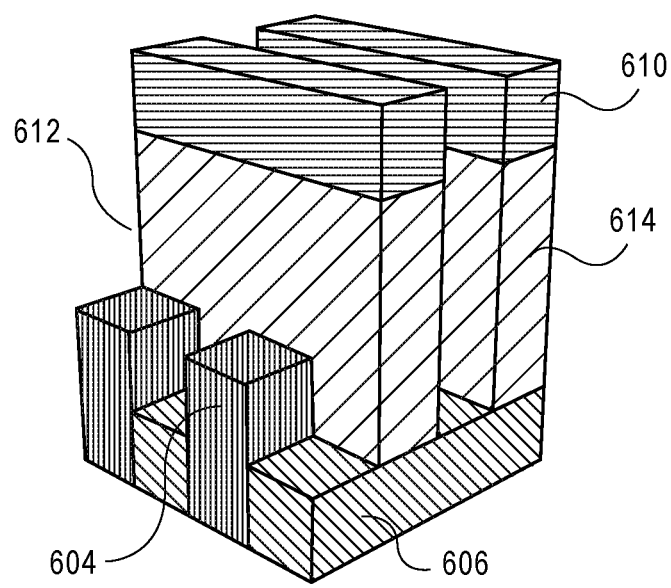

FIG. 6E illustrates the structure of FIG. 6D following trench formation defined using the pattern of the hardmask of FIG. 6D, in accordance with an embodiment of the present disclosure. Referring to FIG. 6E, the exposed regions (i.e., unprotected by 610) of the ILD layer 608 are etched to form trenches 612 and patterned ILD layer 614. The etch stops on, and thus exposes, the top surfaces of the first level metal lines 606 and the ILD lines 604.

Figure 6F:
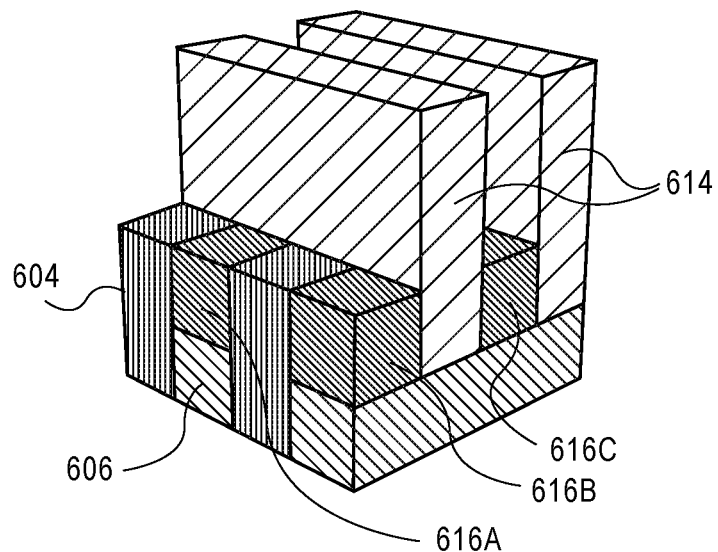

FIG. 6F illustrates the structure of FIG. 6E following an adamantane-based carbon hardmask material formation, in accordance with an embodiment of the present disclosure. Referring to FIG. 6F, an adamantane-based carbon hardmask material 616A, 616B and 616C is formed in possible via locations above exposed portions of the recessed metal lines 606. The adamantane-based carbon hardmask material 616A, 616B and 616C is formed laterally adjacent to the ILD lines 604. Additionally, referring again to FIG. 6F, the hardmask layer 610 may be removed from the patterned ILD layer 614.

Figure 6G:
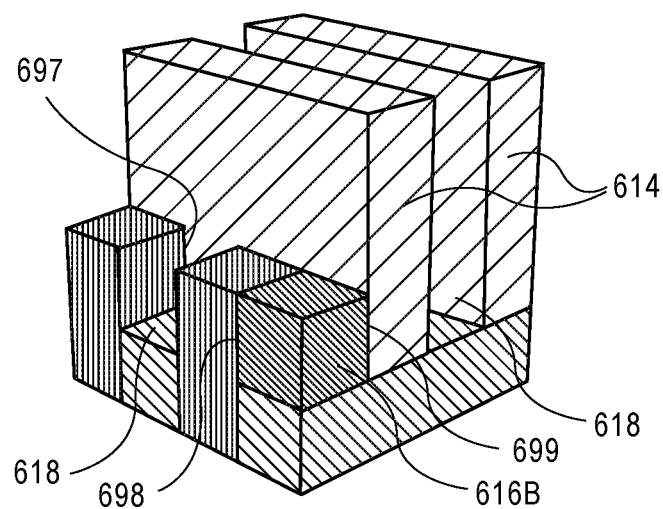

FIG. 6G illustrates the structure of FIG. 6F following removal of portions of the adamantane-based carbon hardmask material to reveal selected via locations. For example, portions 616A and 616C of the adamantane-based carbon hardmask material are removed in select via locations. On the other hand, remaining adamantane-based carbon hardmask material 616B is retained in locations not selected for via formation. In an embodiment, the etch characteristics of the portions 616A and 616C of the adamantane-based carbon hardmask material enable highly selective removal of the portions 616A and 616C of the adamantane-based carbon hardmask material relative to the ILD lines 604 and the ILD lines 614. In one such embodiment, the difference in etch characteristics between the portions 616A and 616C of the adamantane-based carbon hardmask material relative to the ILD lines 604 and the ILD lines 614 enables use of a wider or more relaxed lithographic process, allowing for some overlap and exposure of portions of the ILD lines 604 and/or the ILD lines 614.

Referring again to FIG. 6G, in an embodiment, the resulting structure includes up to three different dielectric material regions (ILD lines 604+ILD lines 614+remaining adamantane-based carbon hardmask material 616B) in a single plane of the metallization structure. In one such embodiment, the ILD lines 604 and ILD lines 614 are composed of a same material. In another such embodiment, the ILD lines 604, and the ILD lines 614 are composed of different ILD materials. In either case, the remaining adamantane-based carbon hardmask material 616B is composed of an adamantane-based carbon hardmask material, examples of which are described above, and is different from the material of the ILD lines 604 and the ILD lines 614. In a specific embodiment, a distinction such as a vertical seam between the materials of ILD lines 604 and ILD lines 614 (e.g., seam 697) and/or between ILD lines 604 and the remaining adamantane-based carbon hardmask material 616B (e.g., seam 698) and/or between ILD lines 614 and the remaining adamantane-based carbon hardmask material 616B (e.g., seam 699) is observed in the final structure.

Figure 6H:
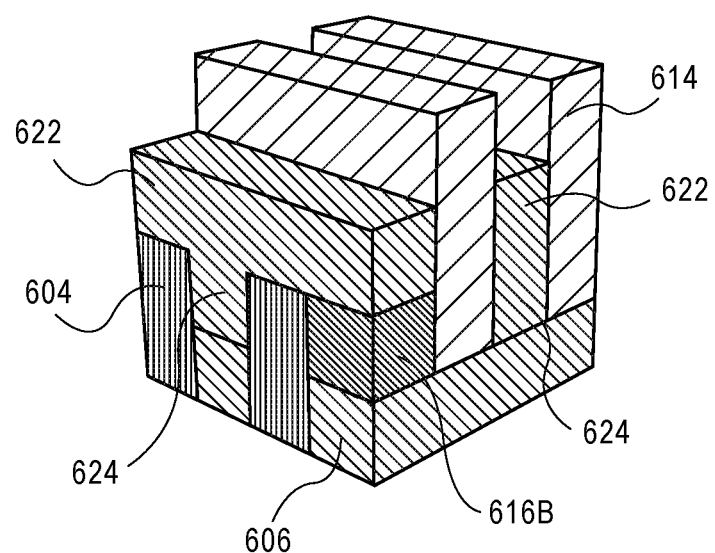

FIG. 6H illustrates the structure of FIG. 6G following metal line and via formation, in accordance with an embodiment of the present disclosure. Referring to FIG. 6H, metal lines 622 and vias 624 are formed upon metal fill of the openings of FIG. 6G. The metal lines 622 are coupled to the underlying metal lines 606 by the vias 624. In an embodiment, the openings are filled in a damascene approach or a bottom-up fill approach to provide the structure shown in FIG. 6H. Thus, the metal (e.g., copper and associated barrier and seed layers) deposition to form metal lines and vias in the above approach may be that typically used for standard back end of line (BEOL) processing. In an embodiment, in subsequent fabrication operations, the ILD lines 614 may be removed to provide air gaps between the resulting metal lines 624. In an embodiment, the remaining adamantane-based carbon hardmask material 616B is retained in the final structure of FIG. 6H, as is depicted in FIG. 6H.

The structure of FIG. 6H may subsequently be used as a foundation for forming subsequent metal line/via and ILD layers. Alternatively, the structure of FIG. 6H may represent the final metal interconnect layer in an integrated circuit. It is to be appreciated that the above process operations may be practiced in alternative sequences, not every operation need be performed and/or additional process operations may be performed. In any case, the resulting structures enable fabrication of vias that are directly centered on underlying metal lines. That is, the vias may be wider than, narrower than, or the same thickness as the underlying metal lines, e.g., due to non-perfect selective etch processing. Nonetheless, in an embodiment, the centers of the vias are directly aligned (match up) with the centers of the metal lines. Furthermore, the ILD used to select which plugs and vias will likely be very different from the primary ILD and will be perfectly self-aligned in both directions. As such, in an embodiment, offset due to conventional lithography/dual damascene patterning that must otherwise be tolerated, is not a factor for the resulting structures described herein. Referring again to FIG. 6H, then, self-aligned fabrication by the subtractive approach may be complete at this stage. A next layer fabricated in a like manner likely requires initiation of the entire process once again. Alternatively, other approaches may be used at this stage to provide additional interconnect layers, such as conventional dual or single damascene approaches.

In a fourth application of materials described herein, techniques for patterning metal line ends are described. To provide context, in the advanced nodes of semiconductor manufacturing, lower level interconnects may created by separate patterning processes of the line grating, line ends, and vias. However, the fidelity of the composite pattern may tend to degrade as the vias encroach upon the line ends and vice-versa. Embodiments described herein provide for a line end process also known as a plug process that eliminates associated proximity rules. Embodiments may allow for a via to be placed at the line end and a large via to strap across a line end.

Figure 7A:
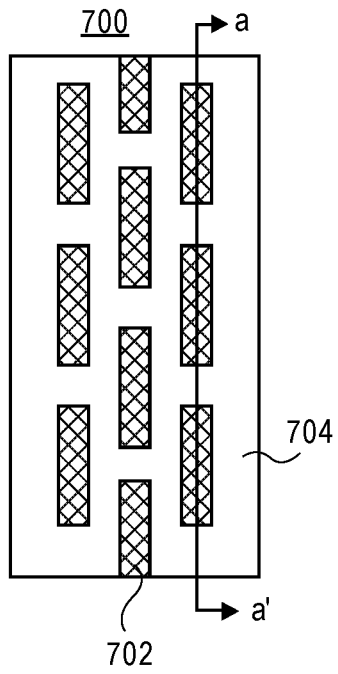
FIG. 7A illustrates a plan view and corresponding cross-sectional view taken along the a-a' axis of the plan view of a metallization layer, in accordance with an embodiment of the present disclosure.
Figure 7A:
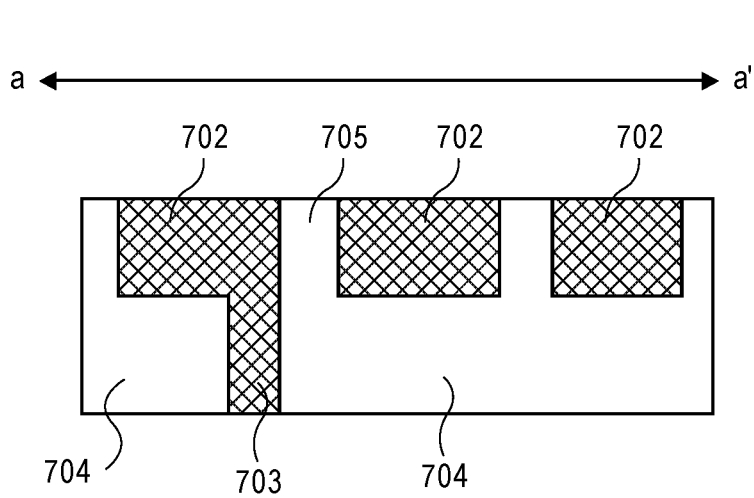
Figure 7B:
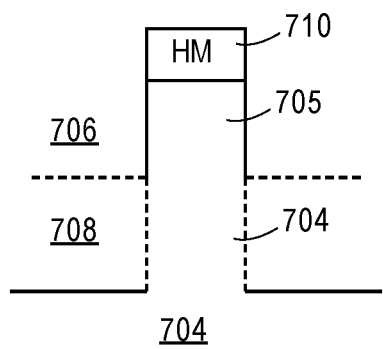
FIG. 7B illustrates a cross-sectional view of a line end or plug, in accordance with an embodiment of the present disclosure.
Figure 7C:
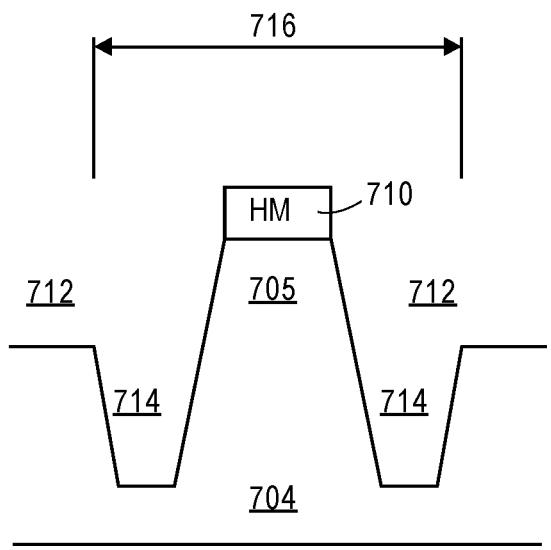
FIG. 7C illustrates another cross-sectional view of a line end or plug, in accordance with an embodiment of the present disclosure.

To provide further context, FIG. 7A illustrates a plan view and corresponding cross-sectional view taken along the a-a' axis of the plan view of a metallization layer, in accordance with an embodiment of the present disclosure. FIG. 7B illustrates a cross-sectional view of a line end or plug, in accordance with an embodiment of the present disclosure. FIG. 7C illustrates another cross-sectional view of a line end or plug, in accordance with an embodiment of the present disclosure.

Referring to FIG. 7A, a metallization layer 700 includes metal lines 702 formed in a dielectric layer 704. The metal lines 702 may be coupled to underlying vias 703. The dielectric layer 704 may include line end or plug regions 705. Referring to FIG. 7B, a line end or plug region 705 of a dielectric layer 704 may be fabricated by patterning a hardmask layer 710 on the dielectric layer 704 and then etching exposed portions of the dielectric layer 704. The exposed portions of the dielectric layer 704 may be etched to a depth suitable to form a line trench 706 or further etched to a depth suitable to form a via trench 708. Referring to FIG. 7C, two vias adjacent opposing sidewalls of the line end or plug 705 may be fabricated in a single large exposure 716 to ultimately form line trenches 712 and via trenches 714.

However, referring again to FIGS. 7A-7C, fidelity issues and/or hardmask erosion issues may lead to imperfect patterning regimes. By contrast, one or more embodiments described herein include implementation of a process flow involving construction of a line end dielectric (plug) after a trench and via patterning process.

In an aspect, then, one or more embodiments described herein are directed to approaches for building non-conductive spaces or interruptions between metals lines (referred to as "line ends," "plugs" or "cuts") and, in some embodiments, associated conductive vias. Conductive vias, by definition, are used to land on a previous layer metal pattern. In this vein, embodiments described herein enable a more robust interconnect fabrication scheme since alignment by lithography equipment is relied on to a lesser extent. Such an interconnect fabrication scheme can be used to relax constraints on alignment/exposures, can be used to improve electrical contact (e.g., by reducing via resistance), and can be used to reduce total process operations and processing time otherwise required for patterning such features using conventional approaches.

FIGS. 8A-8F illustrate plan views and corresponding cross-sectional views representing various operations in a plug last processing scheme, in accordance with an embodiment of the present disclosure.

Figure 8A:
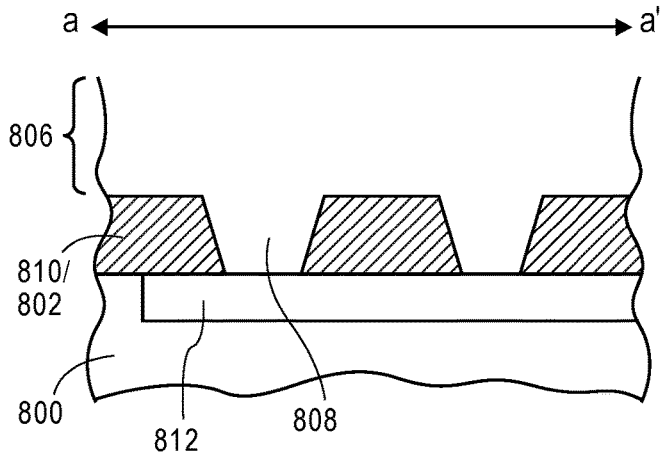
FIGS. 8A-8F illustrate plan views and corresponding cross-sectional views representing various operations in a plug last processing scheme, in accordance with an embodiment of the present disclosure.
Figure 8A:
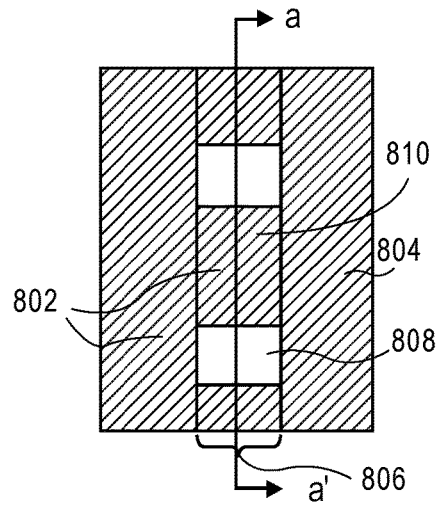

Referring to FIG. 8A, a method of fabricating an integrated circuit structure includes forming a line trench 806 in an upper portion 804 of an interlayer dielectric (ILD) material layer 802 formed above an underlying metallization layer 800. A via trench 808 is formed in a lower portion 810 of the ILD material layer 802. The via trench 808 exposes a metal line 812 of the underlying metallization layer 800.

Figure 8B:
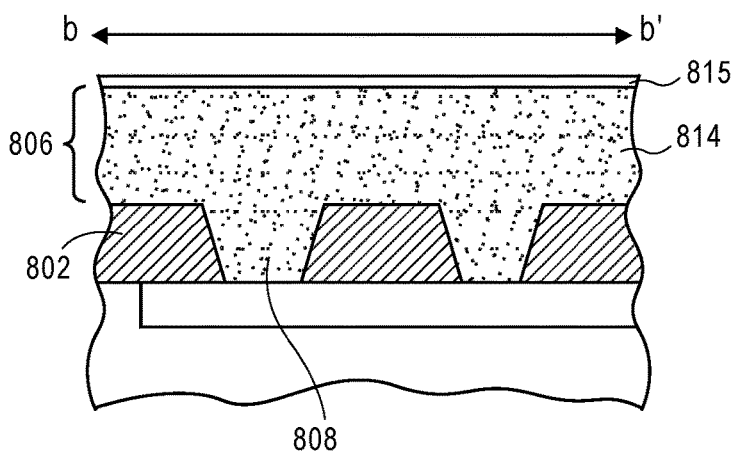
Figure 8B:
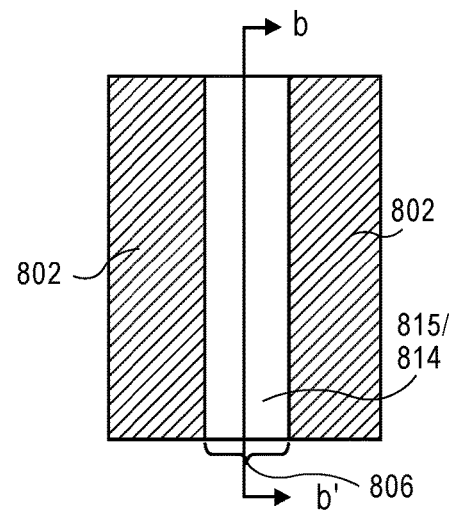

Referring to FIG. 8B, a sacrificial material 814 is formed above the ILD material layer 802 and in the line trench 806 and the via trench 808. The sacrificial material 814 may have a hardmask 815 formed thereon, as is depicted in FIG. 8B.

Figure 8C:
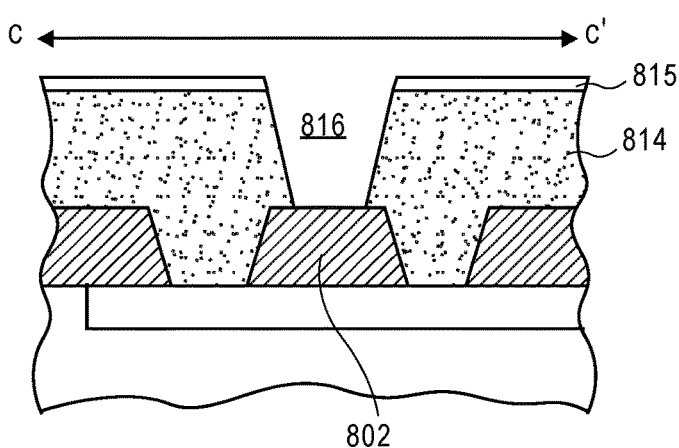
Figure 8C:
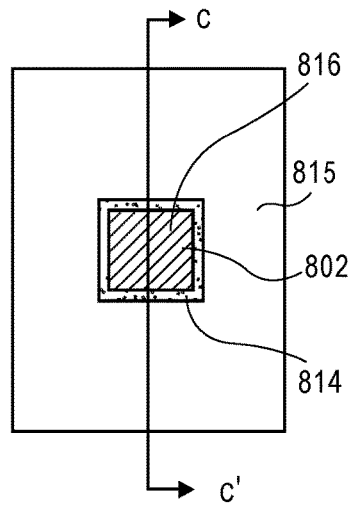

Referring to FIG. 8C, the sacrificial material 814 is patterned to break a continuity of the sacrificial material 814 in the line trench 806, e.g., to provide an opening 816 in the sacrificial material 814.

Figure 8D:
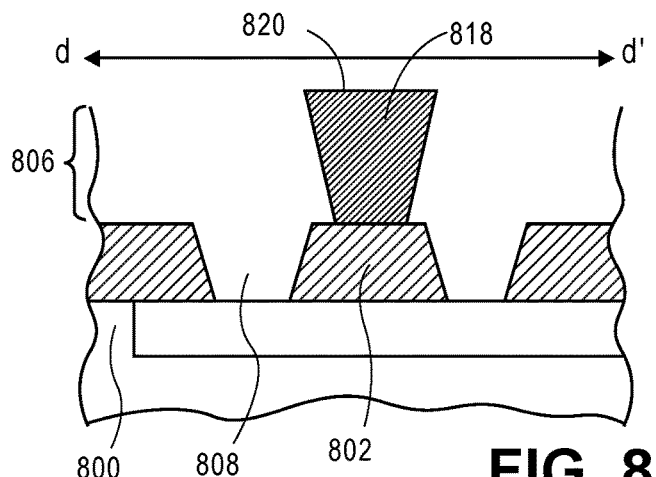
Figure 8D:
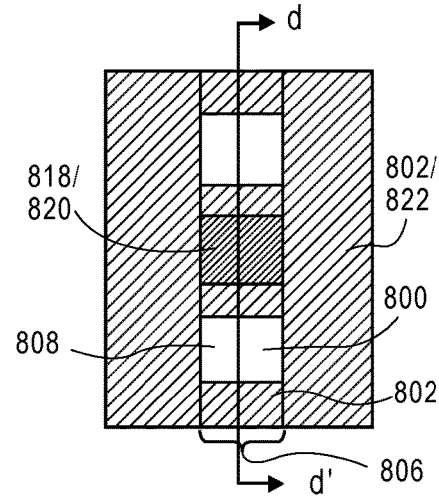

Referring to FIG. 8D, the opening 816 in the sacrificial material 814 is filled with a dielectric material to form a dielectric plug 818. In an embodiment, subsequent to filling the opening 816 in the sacrificial material 814 with the dielectric material, the hardmask 815 is removed to provide the dielectric plug 818 having an upper surface 820 above an upper surface 822 of the ILD material 802, as is depicted in FIG. 8D. The sacrificial material 814 is removed to leave the dielectric plug 818 to remain.

In an embodiment, filling the opening 816 of the sacrificial material 814 with the dielectric material includes filling with an adamantane-based carbon hardmask material. In one such embodiment, filling the opening 814 of the sacrificial material 816 with the adamantane-based carbon hardmask material includes filling using a spin-on process or a flowable chemical vapor deposition process.

Figure 8E:
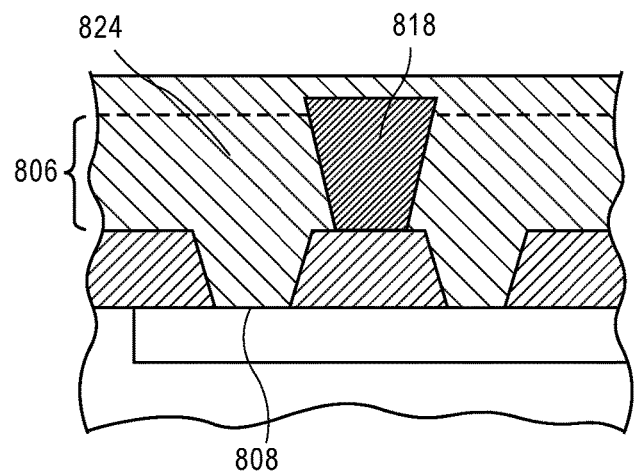
Figure 8E:
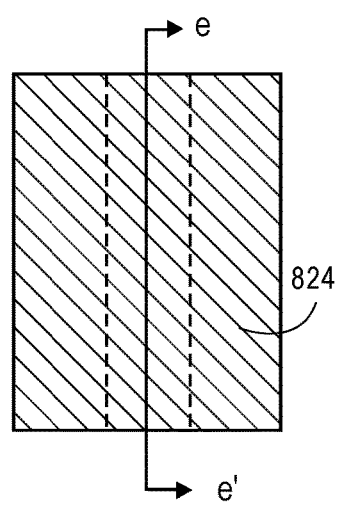

Referring to FIG. 8E, the line trench 806 and the via trench 808 are filled with a conductive material 824. In an embodiment, the conductive material 824 is formed above and over the dielectric plug 818 and the ILD layer 802, as is depicted.

Figure 8F:
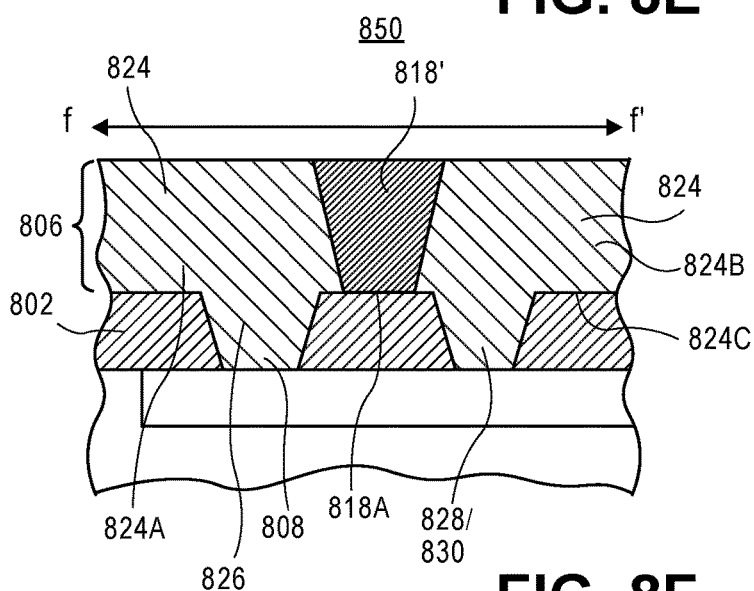
Figure 8F:
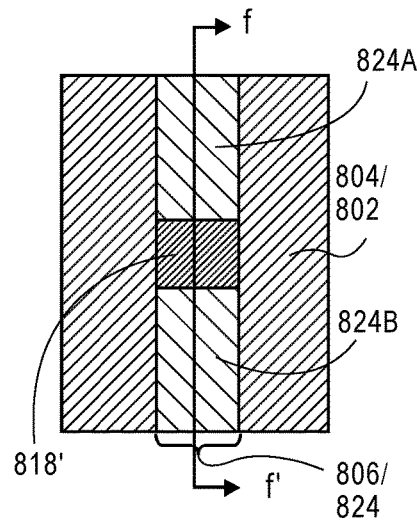

Referring to FIG. 8F, the conductive material 824 and the dielectric plug 818 are planarized to provide a planarized dielectric plug 818' breaking a continuity of the conductive material 824 in the line trench 806.

Referring again to FIG. 8F, in an accordance with an embodiment of the present disclosure, an integrated circuit structure 850 includes an inter-layer dielectric (ILD) layer 802 above a substrate. A conductive interconnect line 824 is in a trench 806 in the ILD layer 802. The conductive interconnect line 824 has a first portion 824A and a second portion 824B, the first portion 824A laterally adjacent to the second portion 824B. A dielectric plug 818' is between and laterally adjacent to the first 824A and second 824B portions of the conductive interconnect line 824. Although not depicted, in an embodiment, the conductive interconnect line 824 includes a conductive barrier liner and a conductive fill material, exemplary materials for which are described above. In one such embodiment, the conductive fill material includes cobalt.

In an embodiment, the dielectric plug 818' includes an adamantane-based carbon hardmask material. In an embodiment, the dielectric plug 818' is in direct contact with the first 824A and second 824B portions of the conductive interconnect line 824.

In an embodiment, the dielectric plug 818' has a bottom 818A substantially co-planar with a bottom 824C of the conductive interconnect line 824. In an embodiment, a first conductive via 826 is in a trench 808 in the ILD layer 802. In one such embodiment, the first conductive via 826 is below the bottom 824C of the interconnect line 824, and the first conductive via 826 is electrically coupled to the first portion 824A of the conductive interconnect line 824.

In an embodiment, a second conductive via 828 is in a third trench 830 in the ILD layer 802. The second conductive via 828 is below the bottom 824C of the interconnect line 824, and the second conductive via 828 is electrically coupled to the second portion 824B of the conductive interconnect line 824.

In an embodiment, the dielectric plug is formed using a spin-on process and does not include a seam. In another embodiment, however, a dielectric plug may be formed using a fill process (e.g., CVD) where artifacts may remain in the fabricated dielectric plug. As an example, FIG. 9A illustrates a cross-sectional view of a conductive line plug having a seam therein, in accordance with an embodiment of the present disclosure.

Figure 9A:
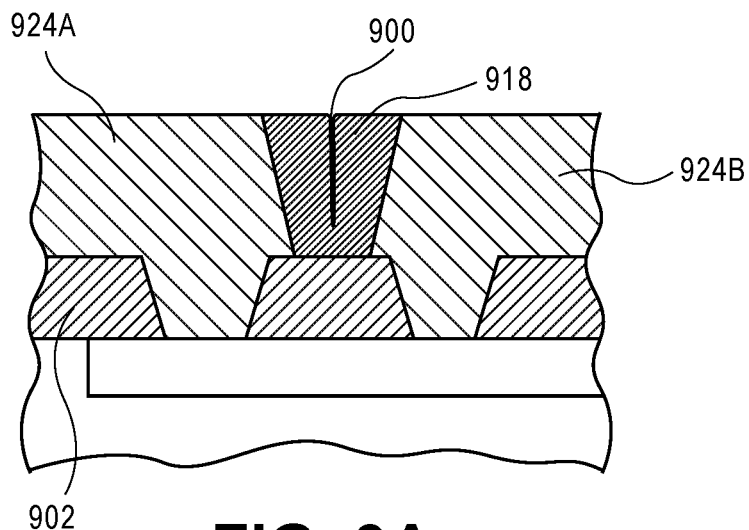
FIG. 9A illustrates a cross-sectional view of a conductive line plug having a seam therein, in accordance with an embodiment of the present disclosure.

Referring to FIG. 9A, a dielectric plug 918 has an approximately vertical seam 900 spaced approximately equally from the first portion 824A of the conductive interconnect line 824 and from the second portion 824B of the conductive interconnect line 824.

It is to be appreciated that dielectric plugs differing in composition from an ILD material in which they are housed may be included on only select metallization layers, such as in lower metallization layers. As an example, FIG. 9B illustrates a cross-sectional view of a stack of metallization layers including a conductive line plug at a lower metal line location, in accordance with an embodiment of the present disclosure.

Figure 9B:
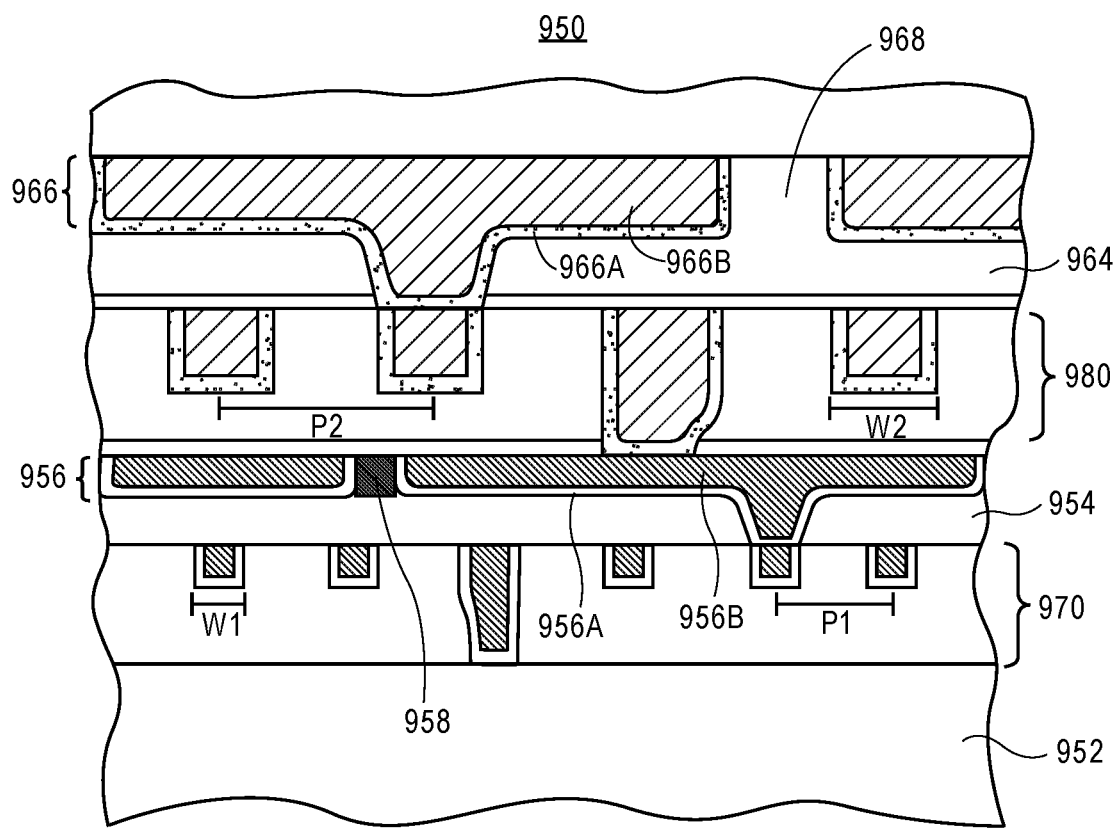
FIG. 9B illustrates a cross-sectional view of a stack of metallization layers including a conductive line plug at a lower metal line location, in accordance with an embodiment of the present disclosure.

Referring to FIG. 9B, an integrated circuit structure 950 includes a first plurality of conductive interconnect lines 956 in and spaced apart by a first inter-layer dielectric (ILD) layer 954 above a substrate 952. Individual ones of the first plurality of conductive interconnect lines 956 have a continuity broken by one or more dielectric plugs 958. In an embodiment, the one or more dielectric plugs 958 include a material different than the ILD layer 952. A second plurality of conductive interconnect lines 966 is in and spaced apart by a second ILD layer 964 above the first ILD layer 954. In an embodiment, individual ones of the second plurality of conductive interconnect lines 966 have a continuity broken by one or more portions 968 of the second ILD layer 964. It is to be appreciated, as depicted, that other metallization layers may be included in the integrated circuit structure 950.

In one embodiment, the one or more dielectric plugs 958 include an adamantane-based carbon hardmask material. In one embodiment, the first ILD layer 954 and the second ILD layer 964 (and, hence, the one or more portions 968 of the second ILD layer 964) include a carbon-doped silicon oxide material.

In one embodiment, individual ones of the first plurality of conductive interconnect lines 956 include a first conductive barrier liner 956A and a first conductive fill material 956B. Individual ones of the second plurality of conductive interconnect lines 966 include a second conductive barrier liner 966A and a second conductive fill material 966B. In one such embodiment, the first conductive fill material 956B is different in composition from the second conductive fill material 966B. In a particular such embodiment, the first conductive fill material 956B includes cobalt, and the second conductive fill material 966B includes copper.

In one embodiment, the first plurality of conductive interconnect lines 956 has a first pitch (P1, as shown in like-layer 970). The second plurality of conductive interconnect lines 966 has a second pitch (P2, as shown in like-layer 980). The second pitch (P2) is greater than the first pitch (P1). In one embodiment, individual ones of the first plurality of conductive interconnect lines 956 have a first width (W1, as shown in like-layer 970). Individual ones of the second plurality of conductive interconnect lines 966 have a second width (W2, as shown in like-layer 980). The second width (W2) is greater than the first width (W1).

It is to be appreciated that the layers and materials described above may be formed in, on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials, such as substrates including germanium, carbon, or group III-V materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structures depicted may be fabricated on underlying lower level back end of line (BEOL) interconnect layers.

Although the preceding methods of fabricating a metallization layer, or portions of a metallization layer, of a BEOL metallization layer are described in detail with respect to select operations, it is to be appreciated that additional or intermediate operations for fabrication may include standard microelectronic fabrication processes such as lithography, etch, thin films deposition, planarization (such as chemical mechanical polishing (CMP)), diffusion, metrology, the use of sacrificial layers, the use of etch stop layers, the use of planarization stop layers, or any other associated action with microelectronic component fabrication. Also, it is to be appreciated that the process operations described for the preceding process flows may be practiced in alternative sequences, not every operation need be performed or additional process operations may be performed or both.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials other than the above described adamantane-based carbon hardmask materials are composed of dielectric materials different from the interlayer dielectric material. In one embodiment, different hardmask materials may be used in different regions so as to provide different growth or etch selectivity to each other and to the underlying dielectric and metal layers. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as oxygen, may be included in one or more of these layers. Alternatively, other hardmask layers known in the arts may be used depending upon the particular implementation. The hardmask layers maybe formed by CVD, PVD, or by other deposition methods.

In an embodiment, as is also used throughout the present description, lithographic operations are performed using 193 nm immersion lithography (i193), extreme ultra-violet (EUV) lithography or electron beam direct write (EBDW) lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

Patterned features may be patterned in a grating-like pattern with lines, holes or trenches spaced at a constant pitch and having a constant width. The pattern, for example, may be fabricated by a pitch halving or pitch quartering approach. In an example, a blanket film (such as a polycrystalline silicon film) is patterned using lithography and etch processing which may involve, e.g., spacer-based-quadruple-patterning (SBQP) or pitch quartering. It is to be appreciated that a grating pattern of lines can be fabricated by numerous methods, including 193 nm immersion lithography (i193), extreme ultra-violet (EUV) and/or electron-beam direct write (EBDW) lithography, directed self-assembly, etc. In other embodiments, the pitch does not need to be constant, nor does the width.

In an embodiment, the term "grating structure" for metal lines, ILD lines or hardmask lines is used herein to refer to a tight pitch grating structure. In one such embodiment, the tight pitch is not achievable directly through conventional lithography. For example, a pattern based on conventional lithography may first be formed, but the pitch may be halved by the use of spacer mask patterning, as is known in the art. Even further, the original pitch may be quartered by a second round of spacer mask patterning. Accordingly, the grating-like patterns described herein may have metal lines, ILD lines or hardmask lines spaced at a constant pitch and having a constant width. The pattern may be fabricated by a pitch halving or pitch quartering, or other pitch division, approach.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
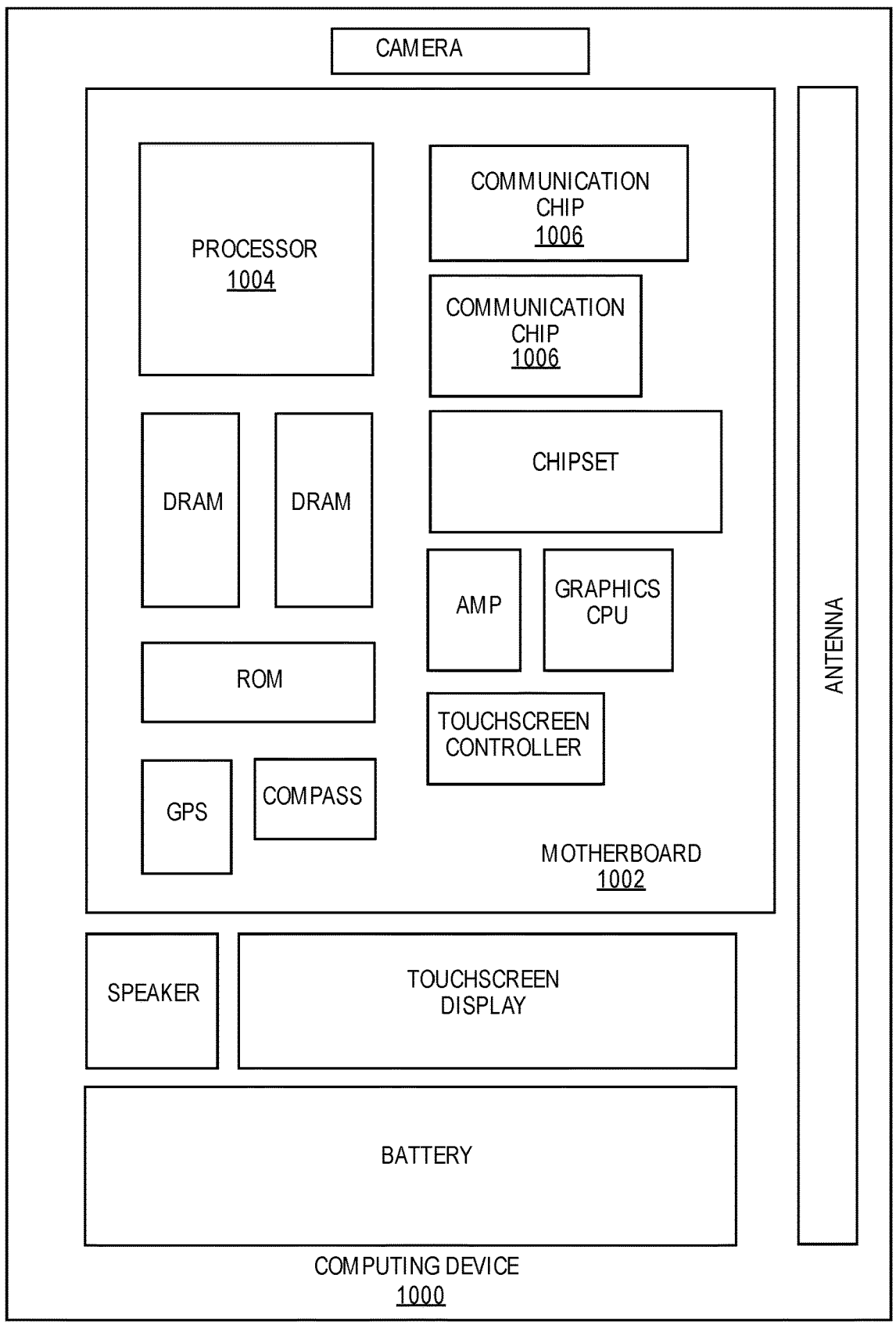
FIG. 10 illustrates a computing device in accordance with one implementation of an embodiment of the disclosure.

FIG. 10 illustrates a computing device 1000 in accordance with one implementation of an embodiment of the disclosure. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In an embodiment, the integrated circuit die of the processor includes or is fabricated using an adamantane-based carbon hardmask material as described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In an embodiment, the integrated circuit die of the communication chip includes or is fabricated using an adamantane-based carbon hardmask material as described herein.

In further implementations, another component housed within the computing device 1000 may contain an integrated circuit die that includes or is fabricated using an adamantane-based carbon hardmask material as described herein.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Figure 11:
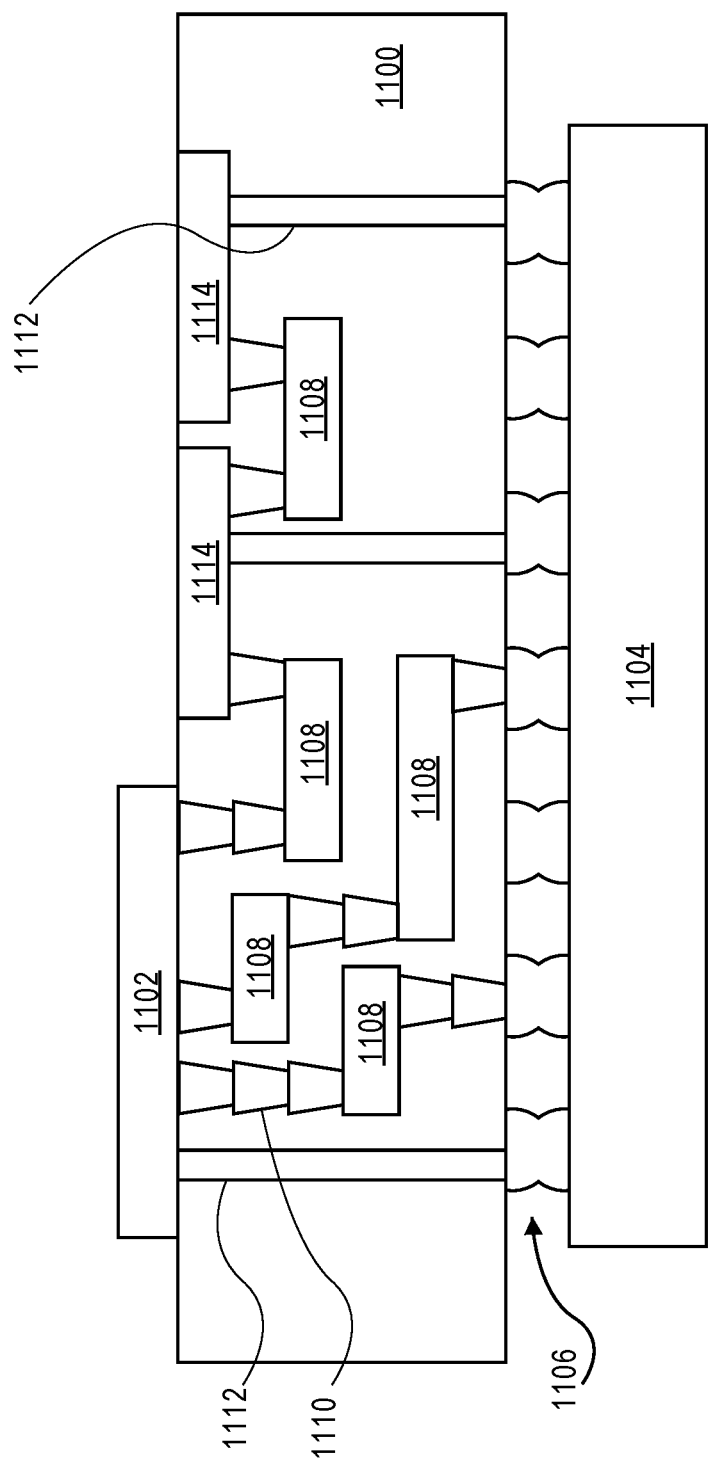
FIG. 11 is an interposer implementing one or more embodiments of the disclosure.

FIG. 11 illustrates an interposer 1100 that includes one or more embodiments of the disclosure. The interposer 1100 is an intervening substrate used to bridge a first substrate 1102 to a second substrate 1104. The first substrate 1102 may be, for instance, an integrated circuit die. The second substrate 1104 may be, for instance, a memory module, a computer motherboard, or another integrated circuit die. Generally, the purpose of an interposer 1100 is to spread a connection to a wider pitch or to reroute a connection to a different connection. For example, an interposer 1100 may couple an integrated circuit die to a ball grid array (BGA) 1106 that can subsequently be coupled to the second substrate 1104. In some embodiments, the first and second substrates 1102/1104 are attached to opposing sides of the interposer 1100. In other embodiments, the first and second substrates 1102/1104 are attached to the same side of the interposer 1100. And in further embodiments, three or more substrates are interconnected by way of the interposer 1100.

The interposer 1100 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1108 and vias 1110, including but not limited to through-silicon vias (TSVs) 1112. The interposer 1100 may further include embedded devices 1114, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1100. In accordance with embodiments of the disclosure, apparatuses or processes disclosed herein may be used in the fabrication of interposer 1100.

Thus, embodiments of the present disclosure include carbon-based dielectric materials for semiconductor structure fabrication, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example Embodiment 1

A method of patterning a layer for a semiconductor structure includes forming a plurality of trenches in a dielectric layer above a semiconductor layer above a substrate to form a patterned dielectric layer. The method also includes filling the plurality of trenches with an adamantane-based carbon hardmask material. The method also includes removing the patterned dielectric layer selective to the adamantane-based carbon hardmask material. The method also includes using the adamantane-based carbon hardmask material to pattern the semiconductor layer.

Example Embodiment 2

The method of example embodiment 1, wherein filling the plurality of trenches with the adamantane-based carbon hardmask material includes using a spin-on deposition process or a flowable chemical vapor deposition process.

Example Embodiment 3

The method of example embodiment 1 or 2, wherein forming the plurality of trenches in the dielectric layer incudes forming the plurality of trenches in a carbon-doped silicon oxide material.

Example Embodiment 4

The method of example embodiment 1, 2 or 3 wherein using the adamantane-based carbon hardmask material to pattern the semiconductor layer includes forming a plurality of semiconductor fins in the semiconductor layer.

Example Embodiment 5

An integrated circuit structure includes a gate stack above a substrate. A first and a second conductive trench contact are at first and second sides of the gate stack, respectively. A first hardmask component is on and aligned with an uppermost surface of the gate stack. A second hardmask component is on and aligned with first and second conductive trench contacts. The first and second hardmask components differ in composition from one another. One of the first hardmask component or the second hardmask component includes an adamantane-based carbon hardmask material. A conductive via is in an opening in the first hardmask component and on a portion of the gate stack.

Example Embodiment 6

The integrated circuit structure of example embodiment 5, wherein a portion of the conductive via is on a portion of the second hardmask component.

Example Embodiment 7

The integrated circuit structure of example embodiment 5 or 6, wherein the first hardmask component includes the adamantane-based carbon hardmask material.

Example Embodiment 8

The integrated circuit structure of example embodiment 5 or 6, wherein the second hardmask component includes the adamantane-based carbon hardmask material.

Example Embodiment 9

An integrated circuit structure includes an inter-layer dielectric (ILD) layer above a substrate. A conductive interconnect line is in a trench in the ILD layer, the conductive interconnect line having a first portion and a second portion, the first portion laterally adjacent to the second portion. A dielectric plug is between and laterally adjacent to the first and second portions of the conductive interconnect line, the dielectric plug including an adamantane-based carbon hardmask material.

Example Embodiment 10

The integrated circuit structure of example embodiment 9, wherein the dielectric plug is in direct contact with the first and second portions of the conductive interconnect line.

Example Embodiment 11

The integrated circuit structure of example embodiment 9 or 10, wherein the dielectric plug does not include a seam.

Example Embodiment 12

The integrated circuit structure of example embodiment 9 or 10, wherein the dielectric plug has an approximately vertical seam spaced approximately equally from the first portion of the conductive interconnect line and from the second portion of the conductive interconnect line.

Example Embodiment 13

The integrated circuit structure of example embodiment 9, 10, 11 or 12, wherein the dielectric plug has a bottom substantially co-planar with a bottom of the conductive interconnect line.

Example Embodiment 14

The integrated circuit structure of example embodiment 9, 10, 11, 12 or 13, further including a first conductive via in a second trench in the ILD layer, the first conductive via below the bottom of the interconnect line, and the first conductive via electrically coupled to the first portion of the conductive interconnect line, and a second conductive via in a third trench in the ILD layer, the second conductive via below the bottom of the interconnect line, and the second conductive via electrically coupled to the second portion of the conductive interconnect line.

Example Embodiment 15

The integrated circuit structure of example embodiment 9, 10, 11, 12, 13 or 14, wherein the conductive interconnect line includes a conductive barrier liner and a conductive fill material, the conductive fill material including cobalt.

Example Embodiment 16

An interconnect structure for an integrated circuit includes a first layer of the interconnect structure disposed above a substrate. The first layer includes a first grating of alternating metal lines and dielectric lines in a first direction. The dielectric lines have an uppermost surface higher than an uppermost surface of the metal lines. A second layer of the interconnect structure is disposed above the first layer of the interconnect structure. The second layer includes a second grating of alternating metal lines and dielectric lines in a second direction, perpendicular to the first direction. The dielectric lines have a lowermost surface lower than a lowermost surface of the metal lines of the second grating. The dielectric lines of the second grating overlap and contact, but are distinct from, the dielectric lines of the first grating. A region of dielectric material is disposed between the metal lines of the first grating and the metal lines of the second grating, and in a same plane as upper portions of the dielectric lines of the first grating and lower portions of the dielectric lines of the second grating. The region of dielectric material includes an adamantane-based carbon hardmask material.

Example Embodiment 17

The interconnect structure of example embodiment 16, further including a conductive via disposed between and coupling a metal line of the first grating to a metal line of the second grating.

Example Embodiment 18

The interconnect structure of example embodiment 17, wherein the conductive via is in the same plane as the region of dielectric material.

Example Embodiment 19

The interconnect structure of example embodiment 16, 17 or 18, wherein the dielectric lines of the first grating are composed of a first dielectric material.

Example Embodiment 20

The interconnect structure of example embodiment 19, and the dielectric lines of the second grating are composed of a second, different dielectric material. The first and second dielectric materials are different than the region of dielectric material composed of the adamantane-based carbon hardmask material.

What is claimed is:

1. A method of patterning a layer for a semiconductor structure, the method comprising:
forming a plurality of trenches in a dielectric layer above a semiconductor layer above a substrate to form a patterned dielectric layer;
filling the plurality of trenches with an adamantane-based carbon hardmask material;
removing the patterned dielectric layer selective to the adamantane-based carbon hardmask material; and
using the adamantane-based carbon hardmask material to pattern the semiconductor layer.

2. The method of claim 1, wherein filling the plurality of trenches with the adamantane-based carbon hardmask material comprises using a spin-on deposition process or a flowable chemical vapor deposition process.

3. The method of claim 1, wherein forming the plurality of trenches in the dielectric layer comprises forming the plurality of trenches in a carbon-doped silicon oxide material.

4. The method of claim 1, wherein using the adamantane-based carbon hardmask material to pattern the semiconductor layer comprises forming a plurality of semiconductor fins in the semiconductor layer.

5. An integrated circuit structure, comprising:
a gate stack above a substrate;
a first and a second conductive trench contact at first and second sides of the gate stack, respectively;
a first hardmask component on and aligned with an uppermost surface of the gate stack;
a second hardmask component on and aligned with first and second conductive trench contacts, the first and second hardmask components differing in composition from one another, and one of the first hardmask component or the second hardmask component comprising an adamantane-based carbon hardmask material; and
a conductive via in an opening in the first hardmask component and on a portion of the gate stack.

6. The integrated circuit structure of claim 5, wherein a portion of the conductive via is on a portion of the second hardmask component.

7. The integrated circuit structure of claim 5, wherein the first hardmask component comprises the adamantane-based carbon hardmask material.

8. The integrated circuit structure of claim 5, wherein the second hardmask component comprises the adamantane-based carbon hardmask material.

9. An integrated circuit structure, comprising:
an inter-layer dielectric (ILD) layer above a substrate;
a conductive interconnect line in a trench in the ILD layer, the conductive interconnect line having a first portion and a second portion, the first portion laterally adjacent to the second portion; and
a dielectric plug between and laterally adjacent to the first and second portions of the conductive interconnect line, the dielectric plug comprising an adamantane-based carbon hardmask material.

10. The integrated circuit structure of claim 9, wherein the dielectric plug is in direct contact with the first and second portions of the conductive interconnect line.

11. The integrated circuit structure of claim 9, wherein the dielectric plug does not include a seam.

12. The integrated circuit structure of claim 9, wherein the dielectric plug has an approximately vertical seam spaced approximately equally from the first portion of the conductive interconnect line and from the second portion of the conductive interconnect line.

13. The integrated circuit structure of claim 9, wherein the dielectric plug has a bottom substantially co-planar with a bottom of the conductive interconnect line.

14. The integrated circuit structure of claim 9, further comprising:
   a first conductive via in a second trench in the ILD layer, the first conductive via below the bottom of the interconnect line, and the first conductive via electrically coupled to the first portion of the conductive interconnect line; and
   a second conductive via in a third trench in the ILD layer, the second conductive via below the bottom of the interconnect line, and the second conductive via electrically coupled to the second portion of the conductive interconnect line.

15. The integrated circuit structure of claim 9, wherein the conductive interconnect line comprises a conductive barrier liner and a conductive fill material, the conductive fill material comprising cobalt.

16. An interconnect structure for an integrated circuit, the interconnect structure comprising:
   a first layer of the interconnect structure disposed above a substrate, the first layer comprising a first grating of alternating metal lines and dielectric lines in a first direction, wherein the dielectric lines have an uppermost surface higher than an uppermost surface of the metal lines; and
   a second layer of the interconnect structure disposed above the first layer of the interconnect structure, the second layer comprising a second grating of alternating metal lines and dielectric lines in a second direction, perpendicular to the first direction, wherein the dielectric lines have a lowermost surface lower than a lowermost surface of the metal lines of the second grating, wherein the dielectric lines of the second grating overlap and contact, but are distinct from, the dielectric lines of the first grating; and
   a region of dielectric material disposed between the metal lines of the first grating and the metal lines of the second grating, and in a same plane as upper portions of the dielectric lines of the first grating and lower portions of the dielectric lines of the second grating, the region of dielectric material comprising an adamantane-based carbon hardmask material.

17. The interconnect structure of claim 16, further comprising:
   a conductive via disposed between and coupling a metal line of the first grating to a metal line of the second grating.

18. The interconnect structure of claim 17, wherein the conductive via is in the same plane as the region of dielectric material.

19. The interconnect structure of claim 16, wherein the dielectric lines of the first grating comprise a first dielectric material, and the dielectric lines of the second grating comprise a second, different dielectric material.

20. The interconnect structure of claim 19, wherein the first and second dielectric materials are different than the region of dielectric material comprising the adamantane-based carbon hardmask material.

* * * * *